United States Patent
Hall et al.

(10) Patent No.: US 6,613,700 B2
(45) Date of Patent: Sep. 2, 2003

(54) METHOD FOR SPIN COATING HIGH VISCOSITY MATERIALS ON SILICON WAFERS

(75) Inventors: David C. Hall, Murphy, TX (US); Juanita G. Miller, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/998,075

(22) Filed: Nov. 30, 2001

(65) Prior Publication Data

US 2002/0076945 A1 Jun. 20, 2002

Related U.S. Application Data

(60) Provisional application No. 60/255,827, filed on Dec. 14, 2000.

(51) Int. Cl.$^7$ .................... H01L 21/31; H01L 21/469; B05D 3/12
(52) U.S. Cl. ................. 438/782; 427/9; 427/240
(58) Field of Search .................. 438/782; 427/9, 427/240

(56) References Cited

U.S. PATENT DOCUMENTS

| | | | | |
|---|---|---|---|---|
| 5,066,616 A | * | 11/1991 | Gordon | 148/DIG. 137 |
| 5,773,083 A | * | 6/1998 | Fischer et al. | 427/240 |
| 5,985,363 A | * | 11/1999 | Shiau et al. | 427/240 |
| 6,033,728 A | * | 3/2000 | Kikuchi et al. | 427/240 |
| 6,117,486 A | * | 9/2000 | Yoshihara | 118/52 |
| 6,379,744 B1 | * | 4/2002 | Gouranlou et al. | 427/240 |

FOREIGN PATENT DOCUMENTS

| | | | | |
|---|---|---|---|---|
| JP | 05-021330 A | * | 1/1993 | B05C/11/08 |
| JP | 2000-077310 A | * | 3/2000 | B05D/1/40 |

* cited by examiner

*Primary Examiner*—Erik Kielin
(74) *Attorney, Agent, or Firm*—Jacqueline J. Garner; W. James Brady, III; Frederick J. Telecky, Jr.

(57) ABSTRACT

A method for spin coating high viscosity materials. Two dispense steps are used. The first dispense step dispenses a small amount (102) of high viscosity material at the center of the wafer (100). A high-speed wafer rotation spreads the material to form a thin layer (104) to prime the surface of the wafer (100) and lower the surface tension without regard to uniformity. A second dispense step occurs at lower RPM and coats (108) the wafer (100) more uniformly.

11 Claims, 2 Drawing Sheets

METHOD FOR SPIN COATING HIGH VISCOSITY MATERIALS ON SILICON WAFERS

This application claims priority under 35 USC 119(e)(1) of provisional application number 60/255,827 filed Dec. 14, 2000.

FIELD OF THE INVENTION

The invention is generally related to the field of high viscosity materials for semiconductor processing and more specifically to photolithography using high viscosity materials.

BACKGROUND OF THE INVENTION

High viscosity materials are applied to semiconductor devices for the purpose of buffer dielectric of photoresist coating. The term high viscosity refers to materials with greater than 1000 centipoise. These viscous materials are difficult to coat with good thickness uniformity. Thickness uniformity becomes more difficult as the diameter of starting wafers gets larger. The centrifugal on the puddle of the material causes internal shear forces that disrupt the flow of fluid. It is difficult to uniformly move the material from the center of the wafer to the edges.

A first method of spin coating, uses a center dispense with high spin speeds. Normally, a high rate of dispense is combined with high RPM (revolutions per minute) spin speeds to force the material from the center dispense point to the edge of the wafer. High viscosity materials have a limited dispense rate typically around 0.5 ml/second maximum. As the dispense RPM increases, the material 12 has a tendency to "ball up"(14) at the edges and not completely cover the wafer 10, as shown in FIGS. 1A and 1B. If a lower dispense speed is used a "dome" profile in resist thickness results, as shown in FIG. 2.

Another method of spin coating uses a swirl dispense method. In this method, a dispense arm is scanned across the wafer as the wafer is rotated. After nearly one revolution, the arm is moved towards the center a precise amount. Another revolution is performed and the arm is moved in again. The dispense is finished at the center and the water rotation is stopped. The wafer is then spun until the material is somewhat uniformly distributed. The wafer is then cast to final thickness. Problems with this method include: (1) timing difference between the pump spin motor and dispense arm, (2) variations in the swirl caused by batch to batch viscosity differences, and (3) high maintenance is required.

SUMMARY OF THE INVENTION

The invention is a method for spin coating high viscosity materials. Two dispense steps are used. The first dispense step dispenses a small amount of high viscosity material at the center of the wafer. A high-speed wafer rotation spreads the material to form a thin layer to prime the surface of the wafer and lower the surface tension without regard to uniformity. A second dispense step occurs at lower RPM and coats the wafer more uniformly.

An advantage of the invention is providing a simple method for spin coating a high viscosity material more uniformly across a wafer surface.

This and other advantages will be apparent to those of ordinary skill in the art having reference to the specification in conjunction with the drawings.

DETAILED DESCRIPTION OF THE EMBODIMENTS

The invention will now be described in conjunction with a photoresist process for forming patterns on semiconductor wafers. It will be apparent to those of ordinary skill in the art that the benefits of the invention may be applied in general to dispensing high viscosity materials over a semiconductor wafer such as polyamide buffer coating or thick film dielectrics.

Photoresist patterns are used at many stages in a semiconductor fabrication process. Photoresist patterns are mainly used to mask implants or to mask various layers during an etch. At each stage a coating material must be applied. The preferred embodiment of the invention may be used to dispense photoresist material at any of these stages.

Figure 1A:
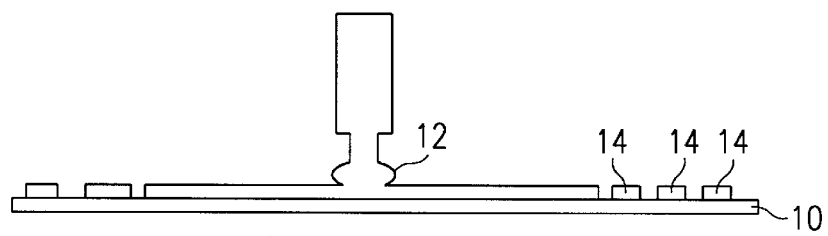
FIG. 1A is a cross-sectional diagram of a prior art dispense method.
Figure 1B:
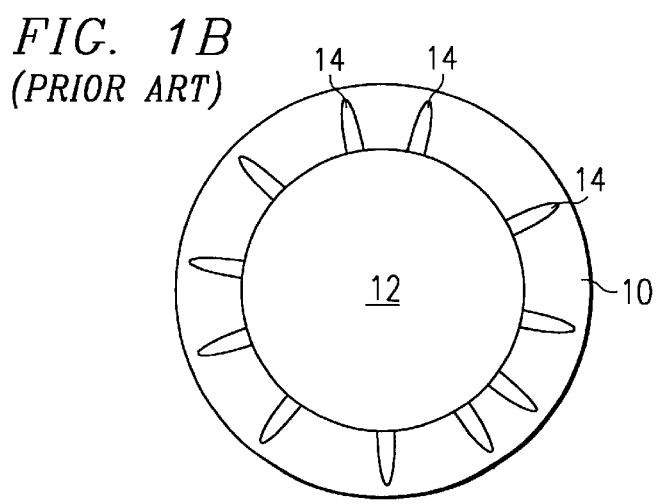
FIG. 1B is a top view of resist dispensed using a prior art method.
Figure 2:
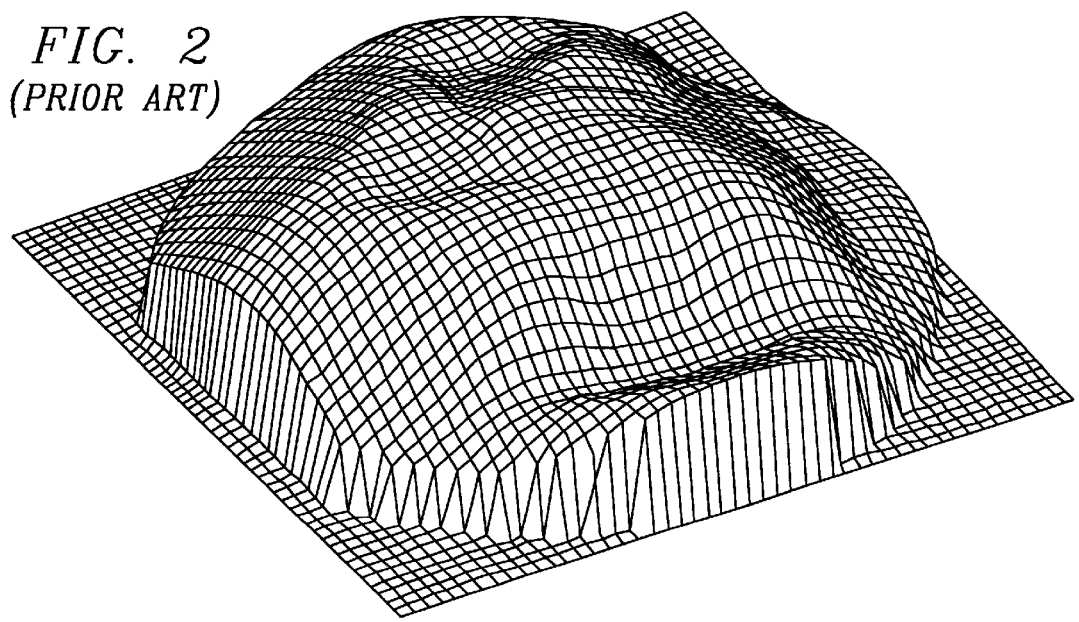
FIG. 2 is a 3-D view of resist dispensed using a prior art swirl method.
Figure 3A:
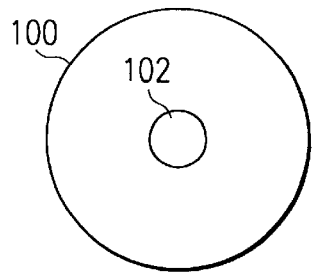
FIGS. 3A–3D are top views of a high viscosity material dispensed according to an embodiment of the invention at various stages in the process.

A preferred embodiment of the invention will now be discussed with reference to FIGS. 3A–3D. A semiconductor wafer 100 is processed to the point where a coating is desired. For example, if the desired coating is for forming an interconnect pattern, semiconductor wafer 100 may have been processed through the formation of transistors, isolation, and interlevel and intrametal dielectrics. In a first step of the invention, a small puddle 102 of high viscosity material, such as a high viscosity organic coating material, is dispensed in the center of wafer 100, as shown in FIG. 3A. Approximately 10–40% of the total high viscosity material to be used is dispensed at this point. For example, approximately 2 cc of a 6 cc dispense may be used for a 200 mm wafer.

Figure 3C:
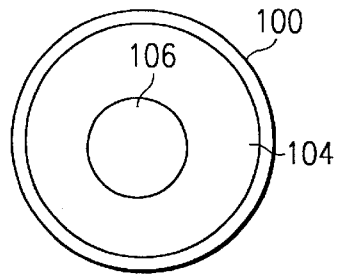
Figure 3B:
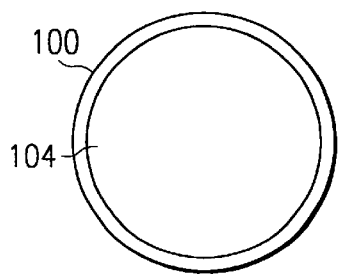

In a second step of the invention, the wafer 100 is spun rapidly to move the material of puddle 102 to the edge of the wafer 100. As a result, a thin layer 104 of high viscosity material covers wafer 100, as shown in FIG. 3B. No high viscosity material is dispensed during this step. The wafer may be spun at a high speed in the range of 2000–4000 RPMs during this step. Low, medium and high speed designations are a function of the wafer size, the substrate, and the material being coated. Generally, the higher speed in this disclosure refers to a speed of 60–100% of maximum. The uniformity of the coverage at this point is of no concern. The purpose of thin layer 104 is to 'prime' the surface of wafer 100 and lower the surface tension for the second dispense step.

Next, the rotation of the wafer is slowed down to between 0%–30% of maximum or 0%–50% of the casting speed. As an example, this may be on the order of 0–1500 RPMs. A second puddle 106 is formed in the center of the wafer with the remaining portion of the high viscosity material, as shown in FIG. 3C. As indicated in the ranges above, this may be a static dispense. For example, the remaining portion may be approximately 4 cc of a 6 cc dispense.

Figure 3D:
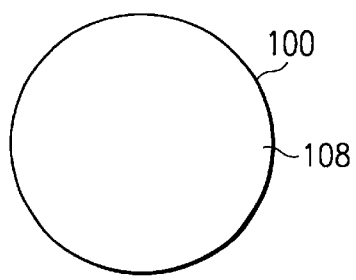

Using a medium rotational speed, the high viscosity material 108 of second puddle 106 spreads evenly across the wafer 100, as shown in FIG. 3D. The medium rotational speed is in the range of 20–60% of maximum or 30–50% of the casting speed. As an example, this may be in the range of 100–1500 RPMs. Uniformity is obtained because (1) the first thin layer 104 lowers the surface tension and primes the surface of wafer 100 and (2) the slower rotational speed results in a more even distribution. The centrifugal forces are reduced which results in a more uniform coat and a reduction in internal shear forces.

Finally, the wafer is spun to the casting speed to set the thickness of the high viscosity material 108. Processing then continues to form the desired pattern in high viscosity material 108.

Figure 4:
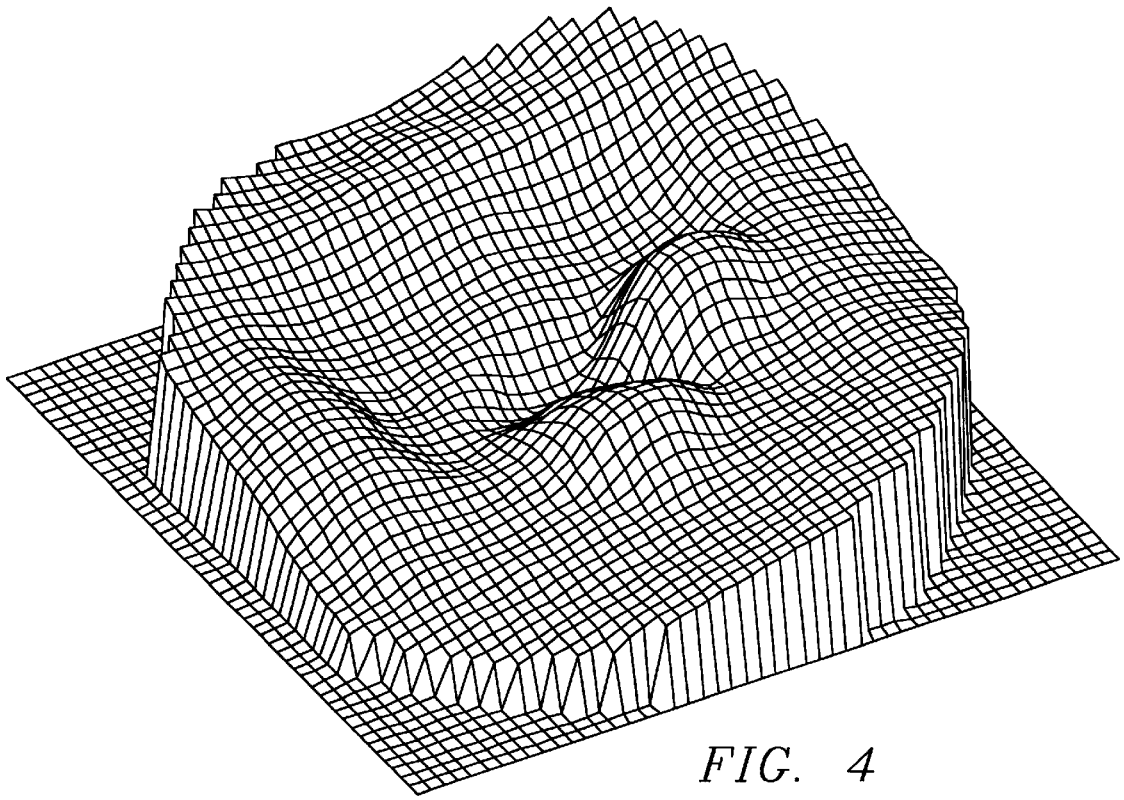
FIG. 4 is a 3-D view of a high viscosity material dispensed according to an embodiment of the invention.

The invention uses two distinct dispense steps separated by a high speed spin. The invention provides improved uniformity with the simplicity of a center dispense. FIG. 4 is a 3-D view of high viscosity resist deposited according to the invention. The thickness variation was 1265 Å for an approximately 80,000 Å film. This compares to a variation of 4737 Å for the prior art center dispense method.

In addition to improved uniformity, a complicated, high maintenance dispense pattern, such as in the prior art swirl dispense, is avoided. The dispense method of the invention also uses less high viscosity material than a swirl dispense pattern (e.g., 6 cc vs. 8 cc) or a single puddle center dispense.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an Integrated circuit comprising the steps of:

providing a partially processed semiconductor wafer;

dispensing a first portion of high viscosity material near a center of said wafer rotating the semiconductor wafer at high speeds;

after said step of rotating the semiconductor wafer at a high speed, dispensing a second portion of said high viscosity material, wherein said semiconductor wafer is rotated at a low speed during said step of dispensing a second portion;

rotating the semiconductor wafer at a medium speed less than said high speed, wherein said step of rotating the semiconductor wafer at a medium speed continues at least until said high viscosity material reaches an edge of the semiconductor wafer; and rotating said semiconductor wafer at a casting speed to set a thickness of the high viscosity material.

2. The method of claim 1, wherein said second portion is greater than said first portion of high viscosity material.

3. The method of claim 1, wherein said second portion is approximately twice said first portion of high viscosity material.

4. The method of claim 1, wherein said high viscosity material comprises a high viscosity organic coating material.

5. The method of claim 1, wherein said high speed is in the range of 2000–4000 RPMs.

6. The method of claim 1, wherein said step of rotating the semiconductor wafer at a high speed separates said steps of dispensing a first portion and dispensing a second portion.

7. The method of claim 1, wherein said medium speed is in the range of 30%–50% of the casting speed and the low speed is in the range of 0% to 50% of the casting speed.

8. A method of fabricating an integrated circuit comprising the steps of:

providing a partially processed semiconductor wafer;

dispensing a first portion of high viscosity material near a center of said wafer;

rotating the semiconductor wafer at a high speed in the range of 60%–100% of a maximum speed;

after said step of rotating the semiconductor wafer at a high speed, slowing the rotation speed of the semiconductor wafer to a speed in the range of 0% to 30% of the maximum;

dispensing a second portion of said high viscosity material after said step of slowing the rotation speed of the semiconductor wafer;

after dispensing the second portion, rotating the semiconductor wafer at a medium speed in the range of 20%–60% of the maximum speed; and rotating said semiconductor wafer at a casting speed to set a thickness of the high viscosity material after the step of rotating the semiconductor wafer at the medium speed.

9. The method of claim 8, wherein said second portion is greater than said first portion of high viscosity material.

10. The method of claim 8, wherein said first portion is in the range of 10%–40% of a total amount of high viscosity material and said second portion is a remaining portion of the total amount of high viscosity material.

11. The method of claim 8, wherein said high viscosity material comprises a high viscosity organic coating material.

* * * * *